(12) United States Patent
Behnke

(10) Patent No.: US 7,863,984 B1
(45) Date of Patent: Jan. 4, 2011

(54) HIGH EFFICIENCY MICROWAVE AMPLIFIER

(75) Inventor: Robert J. Behnke, Erie, CO (US)

(73) Assignee: Vivant Medical, Inc., Boulder, CO (US)

( * ) Notice: Subject to any disclaimer, the term of this patent is extended or adjusted under 35 U.S.C. 154(b) by 0 days.

(21) Appl. No.: 12/504,738

(22) Filed: Jul. 17, 2009

(51) Int. Cl.
*H03G 3/30* (2006.01)

(52) U.S. Cl. ...................... 330/285; 330/297
(58) Field of Classification Search ................ 330/127, 330/129, 278, 279, 285, 296, 297
See application file for complete search history.

(56) References Cited

U.S. PATENT DOCUMENTS

| | | | |
|---|---|---|---|
| 4,296,413 A | 10/1981 | Milkovic | |
| 4,438,766 A | 3/1984 | Bowers | |
| 4,559,943 A | 12/1985 | Bowers | |
| 5,438,302 A | 8/1995 | Goble | |
| 5,452,725 A | 9/1995 | Martenson | |
| 5,531,774 A | 7/1996 | Schulman et al. | |
| 5,830,212 A | 11/1998 | Catmell et al. | |
| 6,090,123 A | 7/2000 | Culp et al. | |
| 6,093,186 A | 7/2000 | Goble | |
| 6,228,081 B1 | 5/2001 | Goble | |
| 6,261,286 B1 | 7/2001 | Goble et al. | |
| 6,293,942 B1 | 9/2001 | Goble et al. | |
| 6,306,134 B1 | 10/2001 | Goble et al. | |
| 6,325,799 B1 | 12/2001 | Goble | |
| 6,364,877 B1 | 4/2002 | Goble et al. | |
| 6,416,509 B1 | 7/2002 | Goble et al. | |
| 6,498,466 B1 | 12/2002 | Edwards | |
| 6,624,702 B1* | 9/2003 | Dening | 330/285 |
| 6,639,471 B2* | 10/2003 | Matsuura et al. | 330/285 |
| 6,720,831 B2* | 4/2004 | Dening et al. | 330/285 |
| 6,723,091 B2 | 4/2004 | Goble et al. | |
| 7,195,627 B2 | 3/2007 | Amoah et al. | |
| 7,211,081 B2 | 5/2007 | Goble | |
| 7,300,436 B2 | 11/2007 | Penny et al. | |
| 7,422,582 B2 | 9/2008 | Malackowski et al. | |

FOREIGN PATENT DOCUMENTS

| | | |
|---|---|---|
| DE | 390937 | 3/1924 |
| DE | 1099658 | 2/1961 |
| DE | 1139927 | 11/1962 |
| DE | 1149832 | 6/1963 |
| DE | 1439302 | 1/1969 |
| DE | 2439587 | 2/1975 |
| DE | 2455174 | 5/1975 |

(Continued)

OTHER PUBLICATIONS

U.S. Appl. No. 08/483,742, filed Jun. 7, 1995.

(Continued)

*Primary Examiner*—Khanh V Nguyen

(57) ABSTRACT

Disclosed is an apparatus and method for operating a microwave amplifier with improved efficiency and reduced harmonic emissions. The disclosed amplifier includes a variable rail voltage supply and a variable input drive stage. A controller continually monitors the amplifier output and adjusts the rail voltage and input drive signal to achieve high efficiency and low harmonic emissions. The amplifier may include a dynamic bias controller configured to operate the gain elements outside the linear region. Efficiencies of over 70% may be achieved by the disclosed amplifier.

21 Claims, 9 Drawing Sheets

FOREIGN PATENT DOCUMENTS

| | | |
|---|---|---|
| DE | 2407559 | 8/1975 |
| DE | 2415263 | 10/1975 |
| DE | 2429021 | 1/1976 |
| DE | 2460481 | 6/1976 |
| DE | 2602517 | 7/1976 |
| DE | 2504280 | 8/1976 |
| DE | 2627679 | 1/1977 |
| DE | 2540968 | 3/1977 |
| DE | 2820908 | 11/1978 |
| DE | 2803275 | 8/1979 |
| DE | 2823291 | 11/1979 |
| DE | 2946728 | 5/1981 |
| DE | 3143421 | 5/1982 |
| DE | 3045996 | 7/1982 |
| DE | 3120102 | 12/1982 |
| DE | 3510586 | 10/1986 |
| DE | 3604823 | 8/1987 |
| DE | 8712328 | 3/1988 |
| DE | 3711511 | 6/1988 |
| DE | 3904558 | 8/1990 |
| DE | 3942998 | 7/1991 |
| DE | 4238263 | 5/1993 |
| DE | 4303882 | 8/1994 |
| DE | 4339049 | 5/1995 |
| DE | 29616210 | 1/1997 |
| DE | 19608716 | 4/1997 |
| DE | 19751106 | 5/1998 |
| DE | 19717411 | 11/1998 |
| DE | 19751108 | 5/1999 |
| DE | 19801173 | 7/1999 |
| DE | 19848540 | 5/2000 |
| DE | 10224154 | 12/2003 |
| DE | 10328514 | 3/2005 |
| DE | 102004022206 | 12/2005 |
| DE | 202005015147 | 3/2006 |
| EP | 0 246 350 | 11/1987 |
| EP | 0 481 685 | 4/1992 |
| EP | 0 521 264 | 1/1993 |
| EP | 0 541 930 | 5/1993 |
| EP | 0 556 705 | 8/1993 |
| EP | 0 558 429 | 9/1993 |
| EP | 0 572 131 | 12/1993 |
| EP | 0 836 868 | 4/1998 |
| EP | 1 159 926 | 5/2001 |
| FR | 179607 | 11/1906 |
| FR | 1 275 415 | 9/1960 |
| FR | 1 347 865 | 11/1963 |
| FR | 2 276 027 | 6/1974 |
| FR | 2 235 669 | 1/1975 |
| FR | 2 313 708 | 12/1976 |
| FR | 2 502 935 | 10/1982 |
| FR | 2 517 953 | 6/1983 |
| FR | 2 573 301 | 11/1984 |
| FR | 2 862 813 | 5/2005 |
| FR | 2 864 439 | 7/2005 |
| JP | 5-5106 | 1/1993 |
| JP | 05-40112 | 2/1993 |
| JP | 06343644 | 12/1994 |
| JP | 07265328 | 10/1995 |
| JP | 08056955 | 3/1996 |
| JP | 08252263 | 10/1996 |
| JP | 09010223 | 1/1997 |
| JP | 11244298 | 9/1999 |
| JP | 2000342599 | 12/2000 |
| JP | 2000350732 | 12/2000 |
| JP | 2001008944 | 1/2001 |
| JP | 2001029356 | 2/2001 |
| JP | 2001128990 | 5/2001 |
| SU | 166452 | 11/1964 |
| SU | 401367 | 11/1974 |
| SU | 727201 | 4/1980 |
| WO | 95/02369 | 1/1995 |
| WO | 98/27880 | 7/1998 |

OTHER PUBLICATIONS

U.S. Appl. No. 08/136,098, filed Oct. 14, 1993.
U.S. Appl. No. 09/195,118, filed Nov. 18, 1998.
U.S. Appl. No. 10/244,346, filed Sep. 16, 2002.
U.S. Appl. No. 11/053,987, filed Feb. 8, 2005.
U.S. Appl. No. 12/023,606, filed Jan. 31, 2008.
U.S. Appl. No. 12/129,482, filed May 29, 2008.
U.S. Appl. No. 12/135,425, filed Jun. 9, 2008.
U.S. Appl. No. 12/135,690, filed Jun. 9, 2008.
U.S. Appl. No. 12/147,093, filed Jun. 26, 2008.
U.S. Appl. No. 12/181,504, filed Jul. 29, 2008.
U.S. Appl. No. 12/184,556, filed Aug. 1, 2008.
U.S. Appl. No. 12/194,254, filed Aug. 19, 2008.
U.S. Appl. No. 12/197,601, filed Aug. 25, 2008.
U.S. Appl. No. 12/197,405, filed Aug. 25, 2008.
U.S. Appl. No. 12/197,473, filed Aug. 25, 2008.
U.S. Appl. No. 12/199,935, filed Aug. 28, 2008.
U.S. Appl. No. 12/203,474, filed Sep. 3, 2008.
U.S. Appl. No. 12/236,686, filed Sep. 24, 2008.
U.S. Appl. No. 12/244,850, filed Oct. 3, 2008.
U.S. Appl. No. 12/250,110, filed Oct. 13, 2008.
U.S. Appl. No. 12/250,171, filed Oct. 13, 2008.
U.S. Appl. No. 12/253,457, filed Oct. 17, 2008.
U.S. Appl. No. 12/277,951, filed Nov. 25, 2008.
U.S. Appl. No. 12/350,292, filed Jan. 8, 2009.
U.S. Appl. No. 12/351,633, filed Jan. 9, 2009.
U.S. Appl. No. 12/353,623, filed Jan. 14, 2009.
U.S. Appl. No. 12/353,617, filed Jan. 14, 2009.
U.S. Appl. No. 12/356,650, filed Jan. 21, 2009.
U.S. Appl. No. 12/366,298, filed Feb. 5, 2009.
U.S. Appl. No. 12/389,906, filed Feb. 20, 2009.
U.S. Appl. No. 12/389,915, filed Feb. 20, 2009.
U.S. Appl. No. 12/395,034, filed Feb. 27, 2009.
U.S. Appl. No. 12/399,222, filed Mar. 6, 2009.
U.S. Appl. No. 12/401,268, filed Mar. 10, 2009.
U.S. Appl. No. 12/413,011, filed Mar. 27, 2009.
U.S. Appl. No. 12/413,023, filed Mar. 27, 2009.
U.S. Appl. No. 12/416,583, filed Apr. 1, 2009.
U.S. Appl. No. 12/419,395, filed Apr. 7, 2009.
U.S. Appl. No. 12/423,609, filed Apr. 14, 2009.
U.S. Appl. No. 12/434,903, filed May 4, 2009.
U.S. Appl. No. 12/436,237, filed May 6, 2009.
U.S. Appl. No. 12/436,239, filed May 6, 2009.
U.S. Appl. No. 12/436,231, filed May 6, 2009.
U.S. Appl. No. 12/472,831, filed May 27, 2009.
U.S. Appl. No. 12/475,082, filed May 29, 2009.
U.S. Appl. No. 12/476,960, filed Jun. 2, 2009.
Alexander et al., "Magnetic Resonance Image-Directed Stereotactic Neurosurgery: Use of Image Fusion with Computerized Tomography to Enhance Spatial Accuracy" Journal Neurosurgery, 83 (1995), pp. 271-276.
Anderson et al., "A Numerical Study of Rapid Heating for High Temperature Radio Frequency Hyperthermia" International Journal of Bio-Medical Computing, 35 (1994), pp. 297-307.
Anonymous. (1999) Auto Suture MIBB Site Marker: Single Use Clip Applier, United States Surgical (Product instructions), 2 pages.
Anonymous. (2001) Disposable Chiba Biopsy Needles and Trays, Biopsy and Special Purpose Needles Cook Diagnostic and Interventional Products Catalog (products list), 4 pages.
Anonymous. (1987) Homer Mammalok™ Breast Lesion Needle/ Wire Localizer, Namic® Angiographic Systems Division, Glens Falls, New York, (Hospital products price list), 4 pages.
Anonymous. (1999) MIBB Site Marker, United States Surgical (Sales brochure), 4 pages.
Anonymous. Blunt Tubes with Finished Ends. Pointed Cannula, Popper & Sons Biomedical Instrument Division, (Products Price List), one page, Jul. 19, 2000.
Anonymous. Ground Cannulae, ISPG, New Milford, CT, (Advertisement) one page, Jul. 19, 2000.

B. Levy M.D. et al., "Update on Hysterectomy New Technologies and Techniques" OBG Management, Feb. 2003.

B. Levy M.D., "Use of a New Vessel Ligation Device During Vaginal Hysterectomy" FIGO 2000, Washington, D.C.

B. Levy M.D. et al., "Randomized Trial of Suture Versus Electrosurgical Bipolar Vessel Sealing in Vaginal Hysterectomy" Obstetrics & Gynecology, vol. 102, No. 1, Jul. 2003.

B. F. Mullan et al., (May 1999) "Lung Nodules: Improved Wire for CT-Guided Localization," Radiology 211:561-565.

B. T. Heniford M.D. et al., "Initial Research and Clinical Results with an Electrothermal Bipolar Vessel Sealer" Oct. 1999.

Bergdahl et al., "Studies on Coagulation and the Development of an Automatic Computerized Bipolar Coagulator" Journal of Neurosurgery 75:1 (Jul. 1991), pp. 148-151.

Bulletin of the American Physical Society, vol. 47, No. 5, Aug. 2002, p. 41.

C. F. Gottlieb et al., "Interstitial Microwave Hyperthermia Applicators having Submillimetre Diameters", Int. J. Hyperthermia, vol. 6, No. 3, pp. 707-714, 1990.

C. H. Durney et al., "Antennas for Medical Applications", Antenna Handbook: Theory Application and Design, p. 24-40, Van Nostrand Reinhold, 1988 New York, V.T. Lo, S.W. Lee.

Carbonell et al., "Comparison of the Gyrus PlasmaKinetic Sealer and the Valleylab LigaSure™ Device in the Hemostasis of Small, Medium, and Large-Sized Arteries" Carolinas Laparoscopic and Advanced Surgery Program, Carolinas Medical Center, Charlotte, NC 2003.

Carus et al., "Initial Experience With The LigaSure™ Vessel Sealing System in Abdominal Surgery" Innovations That Work, Jun. 2002.

Chicharo et al., "A Sliding Goertzel Algorithm" Aug. 1996 DOS pp. 283-297 Signal Processing, Elsevier Science Publishers B.V. Amsterdam, NL, vol. 52, No. 3.

Chou, C.K., (1995) "Radiofrequency Hyperthermia in Cancer Therapy," Chapter 941n Biologic Effects of Nonionizing Electromagnetic Fields, CRC Press, Inc., pp. 1424-1428.

Chung et al., "Clinical Experience of Sutureless Closed Hemorrhoidectomy with LigaSure™" Diseases of the Colon & Rectum, vol. 46, No. 1, Jan. 2003.

Cosman et al., "Radiofrequency Lesion Generation and its Effect on Tissue Impedence", Applied Neurophysiology, 51:230-242, 1988.

Cosman et al., "Theoretical Aspects of Radiofrequency Lesions in the Dorsal Root Entry Zone" Neurosurgery 15:(1984), pp. 945-950.

Cosman et al., "Methods of Making Nervous System Lesions" In William RH, Rengachary SS (eds): Neurosurgery, New York: McGraw-Hill, vol. 111, (1984), pp. 2490-2499.

Crawford et al., "Use of the LigaSure™ Vessel Sealing System in Urologic Cancer Surger" Grand Rounds in Urology 1999, vol. 1, Issue 4, pp. 10-17.

Dulemba et al., "Use of a Bipolar Electrothermal Vessel Sealer in Laparoscopically Assisted Vaginal Hysterectomy" Sales/Product Literature; Jan. 2004.

E. David Crawford, "Evaluation of a New Vessel Sealing Device in Urologic Cancer Surgery" Sales/Product Literature 2000.

E. David Crawford, "Use of a Novel Vessel Sealing Technology in Management of the Dorsal Veinous Complex" Sales/Product Literature 2000.

Esterline Product Literature, "Light Key: Visualize a Virtual Keyboard. One With No Moving Parts", 4 pages.

Esterline, "Light Key Projection Keyboard" 2004 Advanced Input Systems, located at: <http://www.advanced-input.com/lightkey> last visited on Feb. 10, 2005.

Geddes et al., "The Measurement of Physiologic Events by Electrical Impedence" Am. J. MI, Jan. Mar. 1964, pp. 16-27.

Goldberg et al., "Image-guided Radiofrequency Tumor Ablation: Challenges and Opportunities—Part I", (2001) J Vasc. Interv. Radiol, vol. 12, pp. 1021-1032.

Goldberg et al., "Tissue Ablation with Radiofrequency: Effect of Probe Size, Gauge, Duration, and Temperature on Lesion Volume" Acad Radio (1995) vol. 2, No. 5, pp. 399-404.

Heniford et al., "Initial Results with an Electrothermal Bipolar Vessel Sealer" Surgical Endoscopy (2001) 15:799-801.

Herman at al., "Laparoscopic Intestinal Resection With the LigaSure™ Vessel Sealing System: A Case Report" Innovations That Work, Feb. 2002.

Ian D. McRury et al., The Effect of Ablation Sequence and Duration on Lesion Shape Using Rapidly Pulsed Radiofrequency Energy Through Electrodes, Feb. 2000, Springer Netherlands, vol. 4; No. 1, pp. 307-320.

Johnson et al., "Evaluation of a Bipolar Electrothermal Vessel Sealing Device in Hemorrhoidectomy" Sales/Product Literature, Jan. 2004.

Jarrett et al., "Use of the LigaSure™ Vessel Sealing System for Peri-Hilar Vessels in Laparoscopic Nephrectomy" Sales/Product Literature 2000.

Johnson, "Evaluation of the LigaSure™ Vessel Sealing System in Hemorrhoidectormy" American College Of Surgeons (ACS) Clinic La Congress Poster (2000).

Johnson, "Use of the LigaSure™ Vessel Sealing System in Bloodless Hemorrhoidectomy" Innovations That Work, Mar. 2000.

Joseph G. Andriole M.D. et al., "Biopsy Needle Characteristics Assessed in the Laboratory", Radiology 148: 659-662, Sep. 1983.

Joseph Ortenberg, "LigaSure™ System Used in Laparoscopic 1st and 2nd Stage Orchiopexy" Innovations That Work, Nov. 2002.

K. Ogata, Modern Control Engineering, Prentice-Hall, Englewood Cliffs, N.J., 1970.

Kennedy et al., "High-burst-strength, feedback-controlled bipolar vessel sealing" Surgical Endoscopy (1998) 12: 876-878.

Kopans, D.B. et al., (Nov. 1985) "Spring Hookwire Breast Lesion Localizer: Use with Rigid-Compression. Mammographic Systems," Radiology 157(2):537-538.

Koyle et al., "Laparoscopic Palomo Varicocele Ligation in Children and Adolescents" Pediatric Endosurgery & Innovative Techniques, vol. 6, No. 1, 2002.

LigaSure™ Vessel Sealing System, the Seal of Confidence in General, Gynecologic, Urologic, and Laparaoscopic Surgery, Sales/Product Literature, Jan. 2004.

Livraghi et al., (1995) "Saline-enhanced RF Tissue Ablation in the Treatment of Liver Metastases", Radiology, pp. 205-210.

Lyndon B. Johnson Space Center, Houston, Texas, "Compact Directional Microwave Antenna for Localized Heating," NASA Tech Briefs, Mar. 2008.

M. A. Astrahan, "A Localized Current Field Hyperthermia System for Use with 192-Iridium Interstitial Implants" Medical Physics. 9(3), May/Jun. 1982.

Magdy F. Iskander et al., "Design Optimization of Interstitial Antennas", IEEE Transactions on Biomedical Engineering, vol. 36, No. 2, Feb. 1989, pp. 238-246.

McGahan et al., (1995) "Percutaneous Ultrasound-guided Radiofrequency Electrocautery Ablation of Prostate Tissue in Dogs", Acad Radiol, vol. 2, No. 1: pp. 61-65.

McLellan et al., "Vessel Sealing for Hemostasis During Pelvic Surgery" Int'l Federation of Gynecology and Obstetrics FIGO World Congress 2000, Washington, DC.

MDTECH product literature (Mar. 2000) I'D Wire: product description, 1 page.

MDTECH product literature (Dec. 1999) "FlexStrand": product description, 1 page.

Medtrex Brochure "The O.R. Pro 300" 1 page, Sep. 1998.

Michael Choti, "Abdominoperineal Resection with the LigaSure™ Vessel Sealing System and LigaSure™ Atlas 20 cm Open Instrument" Innovations That Work, Jun. 2003.

Muller et al., "Extended Left Hemicolectomy Using the LigaSure™ Vessel Sealing System" Innovations That Work. LJ, Sep. 1999.

Murakami, R. et al., (1995). "Treatment of Hepatocellular Carcinoma: Value of Percutaneous Microwave Coagulation," American Journal of Radiology (AJR) 164:1159-1164.

Ni Wei et al., "A Signal Processing Method for the Coriolis Mass Flowmeter Based on a Normalized . . . " Journal of Applied Sciences Yingyong Kexue Xuebao, Shangha CN, vol. 23, No. 2:(Mar. 2005); pp. 160-184.

Ogden, "Goertzel Alternative to the Fourier Transform" Jun. 1993 pp. 485-487 Electronics World; Reed Business Publishing, Sutton, Surrey, BG, vol. 99, No. 9, 1687.

Olsson M.D. et al., "Radical Cystectomy in Females" Current Surgical Techniques in Urology, vol. 14, Issue 3, 2001.
Organ, L W., "Electrophysiologic Principles of Radiofrequency Lesion Making" Appl. Neurophysiol, vol. 39: pp. 69-76 (1976/77).
P.R. Stauffer et al., "Interstitial Heating Technologies", Thermoradiotheray and Thermochemotherapy (1995) vol. I, Biology, Physiology, Physics, pp. 279-320.
Palazzo et al., "Randomized clinical trial of LigaSure™ versus open haemorrhoidectomy" British Journal of Surgery 2002,89,154-157
"Innovations in Electrosurgery" Sales/Product Literature; Dec. 31, 2000.
Paul G. Horgan, "A Novel Technique for Parenchymal Division During Hepatectomy" The American Journal of Surgery, vol. 181, No. 3, Oapril 2001, pp. 236-237.
Peterson et al., "Comparison of Healing Process Following Ligation with Sutures and Bipolar Vessel Sealing" Surgical Technology International (2001).
R. Gennari et al., (Jun. 2000) "Use of Technetium-99m-Labeled Colloid Albumin for Preoperative and Intraoperative Localization of Non palpable Breast Lesions," American College of Surgeons. 190(6):692-699.
Valleylab Brochure, "Reducing Needlestick Injuries in the Operating Room" 1 page, Mar. 2001.
Reidenbach, (1995) "First Experimental Results with Special Applicators for High-Frequency Interstitial Thermotherapy", Society Minimally Invasive Therapy, 4(Suppl 1):40 (Abstr).
Richard Wolf Medical Instruments Corp. Brochure, "Kleppinger Bipolar Forceps & Bipolar Generator" 3 pages, Jan. 1989.
Rothenberg et al., "Use of the LigaSure™ Vessel Sealing System in Minimally Invasive Surgery in Children" Int'l Pediatric Endosurgery Group (I PEG) 2000.
Sayfan et al., "Sutureless Closed Hemorrhoidectomy: A New Technique" Annals of Surgery, vol. 234, No. 1, Jul. 2001, pp. 21-24.
Sengupta et al., "Use of a Computer-Controlled Bipolar Diathermy System in Radical Prostatectomies and Other Open Urological Surgery" ANZ Journal of Surgery (2001) 71.9 pp. 538-540.
Sigel et al., "The Mechanism of Blood Vessel Closure by High Frequency Electrocoagulation" Surgery Gynecology & Obstetrics, Oct. 1965 pp. 823-831.
Solbiati et al., (2001) "Percutaneous Radio-frequency Ablation of Hepatic Metastases from Colorectal Cancer: Long-term Results in 117 Patients", Radiology, vol. 221, pp. 159-166.
Strasberg et al., "Use of a Bipolar Vassel-Sealing Device for Parenchymal Transection During Liver Surgery" Journal of Gastrointestinal Surgery, vol. 6, No. 4, Jul./Aug. 2002 pp. 569-574.
Stuart W. Young, Nuclear Magnetic Resonance Imaging—Basic Principles, Raven Press, New York, 1984.
Sugita et al., "Bipolar Coagulator with Automatic Thermocontrol" J. Neurosurg., vol. 41, Dec. 1944, pp. 777-779.
Sylvain Labonte et al., "Monopole Antennas for Microwave Catheter Ablation", IEEE Trans. on Microwave Theory and Techniques, vol. 44, No. 10, pp. 1832-1840, Oct. 1995.
T. Matsukawa et al., "Percutaneous Microwave Coagulation Therapy in Liver Tumors", Acta Radiologica, vol. 38, pp. 410-415, 1997.
T. Seki et al., (1994) "Ultrasonically Guided Percutaneous Microwave Coagulation Therapy for Small Hepatocellular Carcinoma," Cancer 74(3):817-825.
S. Humphries Jr. et al., "Finite-Element Codes To Model Electrical Heating And Non-Linear Thermal Transport In Biological Media", Proc. ASME HTD-355, 131 (1997).
Urologix, Inc.-Medical Professionals: Targis™ Technology (Date Unknown). "Overcoming the Challenge" located at: <http://www.urologix.com!medicaUtechnology.html > last visited on Apr. 27, 2001, 3 pages.
Urrutia et al., (1988). "Retractable-Barb Needle for Breast Lesion Localization: Use in 60 Cases," Radiology 169(3):845-847.
Valleylab Brochure, "Valleylab Electroshield Monitoring System" 2 pages, Nov. 1995.
ValleyLab Brochure, "Electosurgery: A Historical Overview", Innovations in Electrosurgery, 1999.
Vallfors et al., "Automatically Controlled Bipolar Electrocoagulation-'COA-COMP'" Neurosurgical Review 7:2-3 (1984) pp. 187-190.

W. Scott Helton, "LigaSure™ Vessel Sealing System: Revolutionary Hemostasis Product for General Surgery" Sales/Product Literature 1999.
Wald et al., "Accidental Burns", JAMA, Aug. 16, 1971, vol. 217, No. 7, pp. 916-921.
Walt Boyles, "Instrumentation Reference Book", 2002, Butterworth-Heinemann, pp. 262-264.
Http://en.wikipedia.org/wiki/Class_A_amplifier; Electronic amplifier; Sep. 18, 2009; 19 pages.
Raymond S. Pengelly, Cree Microwave Inc., "A Comparison between Class E Power Amplifiers employing LDMOS FETs and SiC MESFETs", 2004, IEEE.
European Search Report EP 03721482 dated Feb. 6, 2006.
European Search Report EP 04009964 dated Jul. 28, 2004.
European Search Report EP 04013772 dated Apr. 11, 2005.
European Search Report EP 04015980 dated Nov. 3, 2004.
European Search Report EP 04015981.6 dated Oct. 25, 2004.
European Search Report EP 04027314 dated Mar. 31, 2005.
European Search Report EP 04027479 dated Mar. 17, 2005.
European Search Report EP 04027705 dated Feb. 10, 2005.
European Search Report EP 04710258 dated Oct. 15, 2004.
European Search Report EP 04752343.6 dated Jul. 31, 2007.
European Search Report EP 05002027.0 dated May 12, 2005.
European Search Report EP 05002769.7 dated Jun. 19, 2006.
European Search Report EP 05013463.4 dated Oct. 7, 2005.
European Search Report EP 05013895 dated Oct. 21, 2005.
European Search Report EP 05014156.3 dated Jan. 4, 2006.
European Search Report EP 05016399 dated Jan. 13, 2006.
European Search Report EP 05017281 dated Nov. 24, 2005.
European Search Report EP 05019130.3 dated Oct. 27, 2005.
European Search Report EP 05019882 dated Feb. 16, 2006.
European Search Report EP 05020665.5 dated Feb. 27, 2006.
European Search Report EP 05020666.3 dated Feb. 27, 2006.
European Search Report EP 05021025.1 dated Mar. 13, 2006.
European Search Report EP 05021197.8 dated Feb. 20, 2006.
European Search Report EP 05021777 dated Feb. 23, 2006.
European Search Report EP 05021779.3 dated Feb. 2, 2006.
European Search Report EP 05021780.1 dated Feb. 23, 2006.
European Search Report EP 05021935 dated Jan. 27, 2006.
European Search Report EP 05021936.9 dated Feb. 6, 2006.
European Search Report EP 05021937.7 dated Jan. 23, 2006.
European Search Report EP 05021939 dated Jan. 27, 2006.
European Search Report EP 05021944.3 dated Jan. 25, 2006.
European Search Report EP 05022350.2 dated Jan. 30, 2006.
European Search Report EP 05023017.6 dated Feb. 24, 2006.
European Search Report EP 05025423.4 dated Jan. 19, 2007.
European Search Report EP 05025424 dated Jan. 30, 2007.
European Search Report EP 06000708.5 dated May 15, 2006.
European Search Report EP 06002279.5 dated Mar. 30, 2006.
European Search Report EP 06005185.1 dated May 10, 2006.
European Search Report EP 06005540 dated Sep. 24, 2007.
European Search Report EP 06006717.0 dated Aug. 11, 2006.
European Search Report EP 06006961 dated Oct. 22, 2007.
European Search Report EP 06006963 dated Jul. 25, 2006.
European Search Report EP 06008779.8 dated Jul. 13, 2006.
European Search Report EP 06009435 dated Jul. 13, 2006.
European Search Report EP 06010499.9 dated Jan. 29, 2008.
European Search Report EP 06014461.5 dated Oct. 31, 2006.
European Search Report EP 06018206.0 dated Oct. 20, 2006.
European Search Report EP 06019768 dated Jan. 17, 2007.
European Search Report EP 06020574.7 dated Oct. 2, 2007.
European Search Report EP 06020583.8 dated Feb. 7, 2007.
European Search Report EP 06020584.6 dated Feb. 1, 2007.
European Search Report EP 06020756.0 dated Feb. 16, 2007.
European Search Report EP 06022028.2 dated Feb. 13, 2007.
European Search Report EP 06023756.7 dated Feb. 21, 2008.
European Search Report EP 06024122.1 dated Apr. 16, 2007.
European Search Report EP 06024123.9 dated Mar. 6, 2007.
European Search Report EP 06025700.3 dated Apr. 12, 2007.
European Search Report EP 07000885.9 dated May 15, 2007.
European Search Report EP 07001480.8 dated Apr. 19, 2007.
European Search Report EP 07001481.6 dated May 2, 2007.
European Search Report EP 07001485.7 dated May 23, 2007.

European Search Report EP 07001488.1 dated Jun. 5, 2007.
European Search Report EP 07001489.9 dated Dec. 20, 2007.
European Search Report EP 07001491 dated Jun. 6, 2007.
European Search Report EP 07001527.6 dated May 18, 2007.
European Search Report EP 07007783.9 dated Aug. 14, 2007.
European Search Report EP 07008207.8 dated Sep. 13, 2007.
European Search Report EP 07009026.1 dated Oct. 8, 2007.
European Search Report EP 07009028 dated Jul. 16, 2007.
European Search Report EP 07009029.5 dated Jul. 20, 2007.
European Search Report EP 07009321.6 dated Aug. 28, 2007.
European Search Report EP 07009322.4 dated Jan. 14, 2008.
European Search Report EP 07010672.9 dated Oct. 16, 2007.
European Search Report EP 07010673.7 dated Oct. 5, 2007.
European Search Report EP 07013779.9 dated Oct. 26, 2007.
European Search Report EP 07015191.5 dated Jan. 23, 2007.
European Search Report EP 07015601.3 dated Jan. 4, 2007.
European Search Report EP 07015602.1 dated Dec. 20, 2007.
European Search Report EP 07018375.1 dated Jan. 8, 2008.
European Search Report EP 07018821 dated Jan. 14, 2008.
European Search Report EP 07019173.9 dated Feb. 12, 2008.
European Search Report EP 07019174.7 dated Jan. 29, 2008.
European Search Report EP 07019178.8 dated Feb. 12, 2008.
European Search Report EP 07020283.3 dated Feb. 5, 2008.
European Search Report EP 07253835.8 dated Dec. 20, 2007.
European Search Report EP 08001019 dated Sep. 23, 2008.
European Search Report EP 08004975 dated Jul. 24, 2008.
European Search Report EP 08006731.7 dated Jul. 29, 2008.
European Search Report EP 08006733 dated Jul. 7, 2008.
European Search Report EP 08006734.1 dated Aug. 18, 2008.
European Search Report EP 08006735.8 dated Jan. 8, 2009.
European Search Report EP 08015842 dated Dec. 5, 2008.
European Search Report EP 98300964.8 dated Dec. 13, 2000.
European Search Report EP 98944778 dated Nov. 7, 2000.
European Search Report EP 98958575.7 dated Oct. 29, 2002.
International Search Report PCT/US01/11218 dated Aug. 14, 2001.
International Search Report PCT/US01/11224 dated Nov. 13, 2001.
International Search Report PCT/US01/11340 dated Aug. 16, 2001.
International Search Report PCT/US01/11420 dated Oct. 16, 2001.
International Search Report PCT/US02/01890 dated Jul. 25, 2002.
International Search Report PCT/US02/11100 dated Jul. 16, 2002.
International Search Report PCT/US03/09483 dated Aug. 13, 2003.
International Search Report PCT/US03/22900 dated Dec. 2, 2003.
International Search Report PCT/US03/37110 dated Jul. 25, 2005.
International Search Report PCT/US03/37111 dated Jul. 28, 2004.
International Search Report PCT/US03/37310 dated Aug. 13, 2004.
International Search Report PCT/US04/04685 dated Aug. 27, 2004.
International Search Report PCT/US04/13273 dated Dec. 15, 2004.
International Search Report PCT/US04/15311 dated Jan. 12, 2004.
International Search Report PCT/US98/18640 dated Jan. 29, 1998.
International Search Report PCT/US98/23950 dated Jan. 14, 1998.
International Search Report PCT/US99/24869 dated Feb. 11, 2000.
"Electronic amplifier", http://en.wikipedia.org/wiki/Class_A_amplifier, Mar. 22, 2004.
"A Comparison between Class E Power Amplifiers employing LDMOS FETs and SiC MESFETSs"; Raymond S. Pengelly, Cree Microwave, Inc. 2004.

* cited by examiner

Capacitance vs. Drain-To-Source Voltage

HIGH EFFICIENCY MICROWAVE AMPLIFIER

BACKGROUND

1. Technical Field

The present disclosure relates to systems and methods for providing energy to biological tissue and, more particularly, to improved apparatus and methods for amplifying microwave energy for use during surgical procedures.

2. Background of Related Art

Energy-based tissue treatment is well known in the art. Various types of energy (e.g., electrical, ultrasonic, microwave, cryogenic, thermal, laser, etc.) are applied to tissue to achieve a desired result. Electrosurgery involves application of high radio frequency electrical current to a surgical site to cut, ablate, coagulate or seal tissue. In monopolar electrosurgery, a source or active electrode delivers radio frequency energy from the electrosurgical generator to the tissue and a return electrode carries the current back to the generator. In monopolar electrosurgery, the source electrode is typically part of the surgical instrument held by the surgeon and applied to the tissue to be treated. A patient return electrode is placed remotely from the active electrode to carry the current back to the generator.

In tissue ablation electrosurgery, the radio frequency energy may be delivered to targeted tissue by an antenna or probe. In this instance, a high radio frequency electrical current in a microwave range of about 900 MHz to about 5 GHz is applied to a targeted tissue site to create an ablation volume, which may have a particular size and shape. Typically, microwave apparatus for use in ablation procedures include a microwave generator, which functions as an energy source, and a microwave surgical instrument having an antenna assembly for directing the energy to the target tissue. The microwave generator and surgical instrument are typically operatively coupled by a cable assembly having a plurality of conductors for transmitting microwave energy from the generator to the instrument, and for communicating control, feedback and identification signals between the instrument and the generator.

The microwave generator commonly includes a microwave oscillator coupled to a power amplifier. The microwave oscillator generates a relatively low-power surgical signal that is amplified by a microwave amplifier to produce a signal of sufficient power to achieve the desired effect, e.g., tissue ablation. A user, typically a surgeon, may specify a particular output level, which may be accomplished by varying the amplitude of the relatively low-power input surgical signal to the microwave amplifier. With decreasing input levels, an amplifier operates in linear mode where efficiency decreases, e.g., thermal power dissipation increases. Conversely, with increasing input levels, an amplifier operates at or near saturation mode where maximum efficiency is achieved and thermal power dissipation is at a minimum.

Commonly used microwave power amplifiers are known to be inefficient. For example, a class AB microwave power amplifier typically exhibits an efficiency of about 35%. That is, to achieve a surgical signal of 250 W, a class AB power amplifier requires about 714 W of power, of which 464 W is dissipated as thermal energy. The resulting heat becomes difficult to manage and may require the use of bulky and costly cooling systems, e.g., fans and heat sinks. Additionally, the excess heat may cause thermal stress to other components of the generator, shortening generator life, decreasing reliability, and increasing maintenance costs.

Additionally, a class AB amplifier may exhibit crossover distortion that introduces undesirable harmonics into the surgical signal, which are known to cause radiofrequency interference in excess of acceptable limits.

SUMMARY

The present disclosure provides a method and apparatus for an improved microwave ablation amplifier having a push-pull configuration which exhibits improved efficiency over a wide range of power output levels. A generator in accordance with the present disclosure may also exhibit reduced harmonics in the high-power surgical output signal, which reduces undesirable radiofrequency interference. In accordance with the present disclosure, a low power input signal is maintained at a constant, relatively high level, while the output level of the amplifier is adjusted, at least partially, by varying the supply voltage (e.g., the "rail" voltage) of a push-pull class B amplifier output stage. At least one LDMOS (laterally diffused metal oxide semiconductor) transistor, such as without limitation, a BLC6G10LS-160, manufactured by NXP Semiconductors of Eindhoven, The Netherlands, may be included in the amplifier output stage.

Also presented is a method and apparatus for controlling the disclosed microwave generator. A disclosed amplifier control unit is in operable communication with at least one sensor configured to receive a sensor signal indicative of one or more operating condition of the generator and/or amplifier circuit. The amplifier control unit is operably coupled to a rail voltage control unit and a drive control unit. The rail voltage control unit is configured to receive a rail voltage control signal and in response thereto provide a rail control voltage in accordance therewith to an amplifier output stage. The drive control unit is configured to receive a drive control signal and in response thereto provide a drive signal in accordance therewith to an input of the amplifier output stage. The drive control unit may also include an input to receive a relatively low power microwave signal. Additionally or alternatively, a signal source may be included within the drive control unit.

The amplifier control unit, in response to an at least one sensor signal, dynamically varies an operating parameter, e.g., a rail voltage and/or an input level, to achieve efficient and stable operation of the generator over a range of output power levels. The control unit may impose a rail voltage minima on the presently disclosed amplifier. For example, the rail voltage may be held to greater than about 14V in order to avoid undesirable increases in the internal capacitance of an LDMOS device, such as without limitation a BLC6G10LS-160 UHF power LDMOS transistor manufactured by NXP B.V. of The Netherlands, which may cause the amplifier to detune and/or become unstable. The minimum rail voltage is dependent upon the LDMOS utilized in an embodiment, and embodiments utilizing LDMOS devices other than a BLC6G10LS-160 may require a minimum rail voltage that is greater than, or less than, about 14V. In another example, at a lower portion of the amplifier's operating power, the controller may be configured to increase power output by first causing the drive attenuation control unit to output a signal of sufficient amplitude to cause the LDMOS device(s) to operate outside the linear operating region thereof, thereby achieving improved operating efficiency. When the LDMOS devices are operating outside the linear region, output power may be further increased by increasing the rail voltage. The drive signal may be correlated to the rail voltage, e.g., the drive signal may be increased proportionally to the rail voltage.

The controller may include a processor having the capability of executing a set of programmed instructions for executing a method of controlling a microwave ablation generator as disclosed herein.

In an embodiment, the disclosed electromagnetic signal amplifier includes a gain stage electrically disposed between a supply rail and a return rail. The gain stage includes an input and an output. A rail voltage controller is coupled to the supply rail and/or the return rail, wherein the rail voltage controller includes is configured to provide a rail voltage responsive to a rail voltage control signal. A drive controller is coupled to the gain stage input and provide an input signal to the gain stage in response to a drive control signal. The disclosed electromagnetic signal amplifier includes a sensor configured to sense an operational parameter of the amplifier, such as an output voltage, and to provide a corresponding sensor signal to an amplifier controller. The amplifier controller is configured to provide a rail voltage control signal to the rail voltage controller, and a drive control signal to the drive controller.

The present disclosure is also directed to a method for controlling a microwave amplifier that includes setting a rail voltage to a minimum value and a drive signal to a minimum amplitude. The resultant output signal level is measured and compared to a desired output signal level. The desired output signal level may be determined by the user. If the output signal is not equal (or not substantially equal to) the desired output level, the value of the drive signal is examined. If the drive signal is not at a maximum value, the drive signal is increased. If the drive signal equals (or substantially equals) a maximum value, the rail voltage is increased.

Also disclosed is a method of controlling a microwave amplifier that includes setting a rail voltage to an initial value, which may be a minimum value. A rail current is measured and compared to a target criteria, e.g., 0.1 A. If the rail current does not meet (e.g., not equal to or substantially not equal to) the target criteria, the bias voltage is increased. If the rail current meets (e.g., equal to or substantially equal to) the target criteria, the bias voltage value is stored, and the rail voltage is increased. If the rail voltage does not meet the target criteria, then the bias voltage is adjusted accordingly until the target voltage is met. The rail current is again measured and the process iterates until the rail voltage is at a maximum value.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION

Particular embodiments of the present disclosure are described hereinbelow with reference to the accompanying drawings; however, it is to be understood that the disclosed embodiments are merely exemplary of the disclosure, which may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure.

Figure 1:
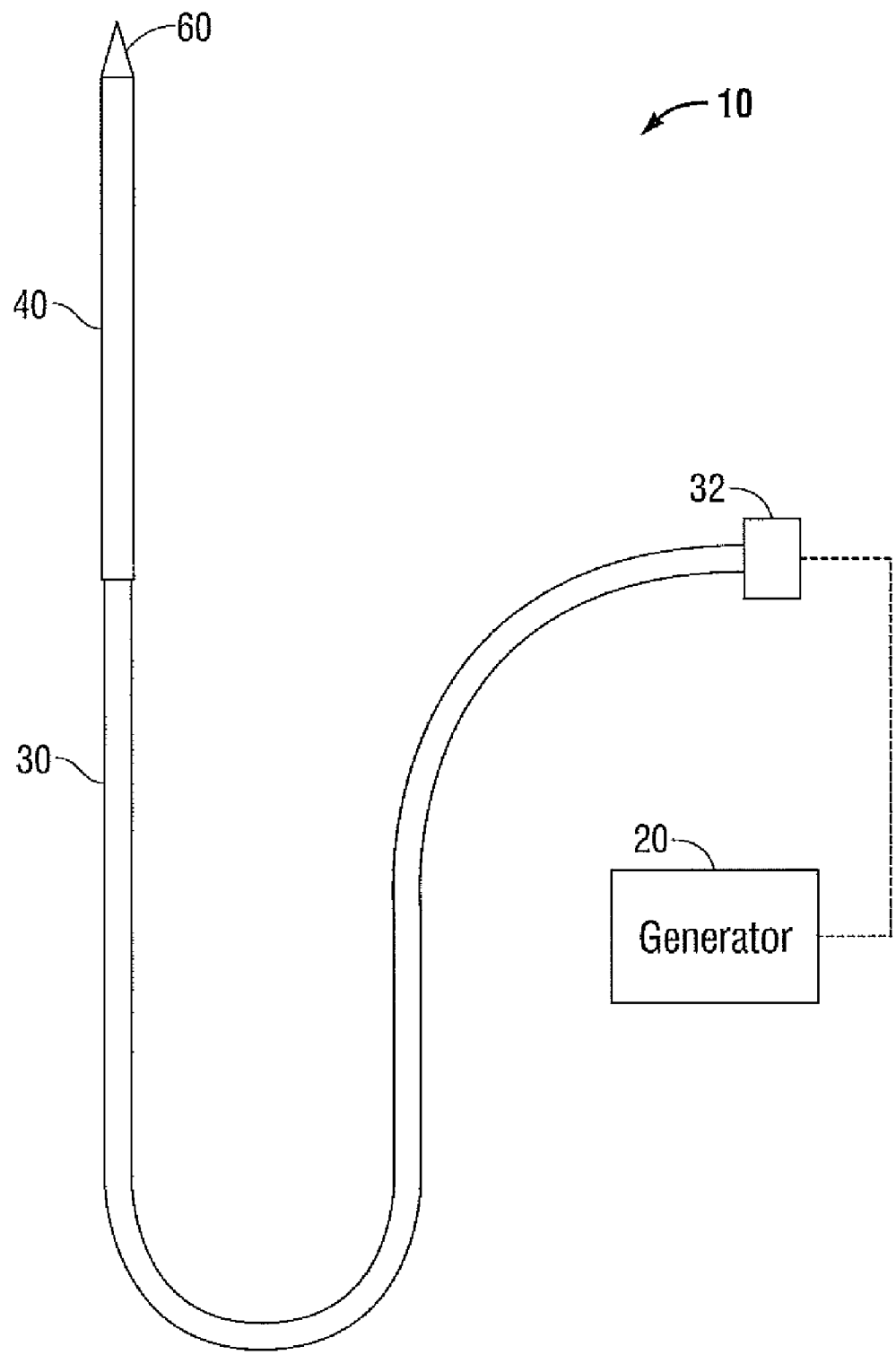
FIG. 1 shows a diagram of a microwave ablation system having an electromagnetic surgical ablation probe in accordance with the present disclosure.

FIG. 1 shows an embodiment of a microwave ablation system 10 in accordance with the present disclosure. The microwave ablation system 10 includes an electromagnetic surgical ablation probe 40 connected by a cable 30 to a connector 32, which may further operably connect the probe 40 to a generator assembly 20. Generator assembly 20 may include a source of ablation energy, e.g., microwave or RF energy in the range of about 500 MHz to about 5 GHz.

Figure 2:
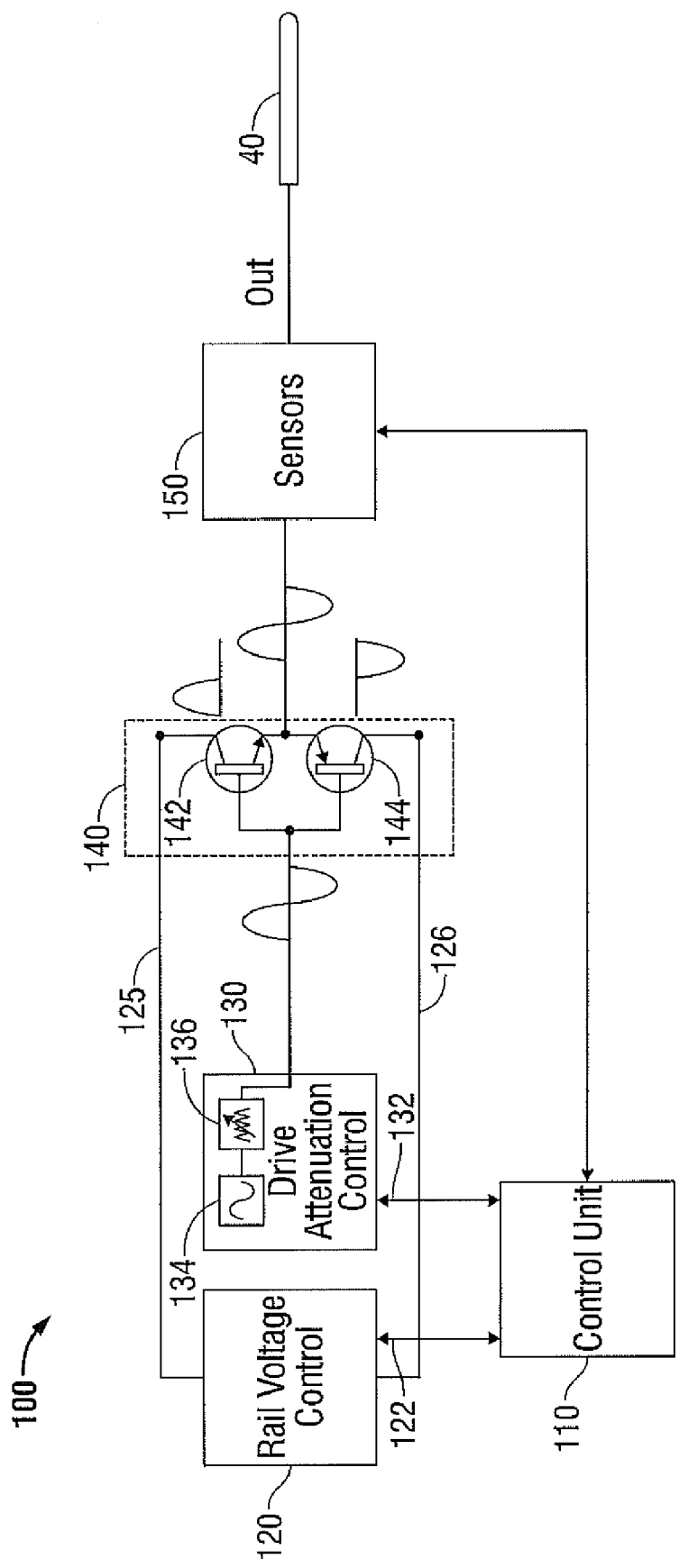
FIG. 2 is a block diagram of an amplifier having rail voltage and drive attenuation control in accordance with the present disclosure.

With reference to FIG. 2, a block diagram of a push-pull amplifier 100 having a push-pull output stage 140 is presented. Output stage 140 may be configured as a class B push-pull output stage having a complementary pair of transistors 142, 144. Transistor 142 may be an NPN transistor that is configured to supply current from supply rail 125 to an output load, e.g., a microwave ablation probe 105. Transistor 144 may be a PNP transistor that is configured to sink current from the output load to a ground rail 126. Ground rail 126 may be alternatively be configured as a negative supply rail.

Amplifier 100 includes amplifier controller 110 that is configured to receive at least one sensor signal and in response thereto output at least one corresponding control signal to at least one of a rail voltage controller 120 and a drive controller 130. Amplifier controller 110 is operably coupled to at least one sensor 150 that is adapted to sense an electrical property of an output signal, e.g., voltage, current, impedance. Additionally or alternatively, sensor 150 may sense an instantaneous, peak, RMS, or moving average property of an output signal. Amplifier controller 110 may be configured to perform a method of controlling a push pull amplifier 100 as will be described in further detail hereinbelow.

Rail voltage controller 120 is configured to provide a variable output voltage to supply rail 125 in response to a rail voltage control signal (not explicitly shown) received from amplifier controller 110. The rail voltage control signal may be any suitable signal, e.g., an analog or digital signal. Rail voltage controller 120 may include a power supply having a fixed or variable output voltage. It is envisioned that rail voltage controller 120 may encompass any suitable manner of voltage regulation, such as, and without limitation, an LM317 voltage regulator integrated circuit manufactured by National Semiconductor Corp. of Santa Clara, Calif., US. In an embodiment supply rail 125 is referenced to ground at return rail 126. Rail voltage controller 120 may be configured to provide a bipolar supply wherein e.g., a positive voltage is provided by rail voltage controller 120 to supply rail 125 and a negative voltage is provided by rail voltage controller 120 to return rail 126.

Figure 3:
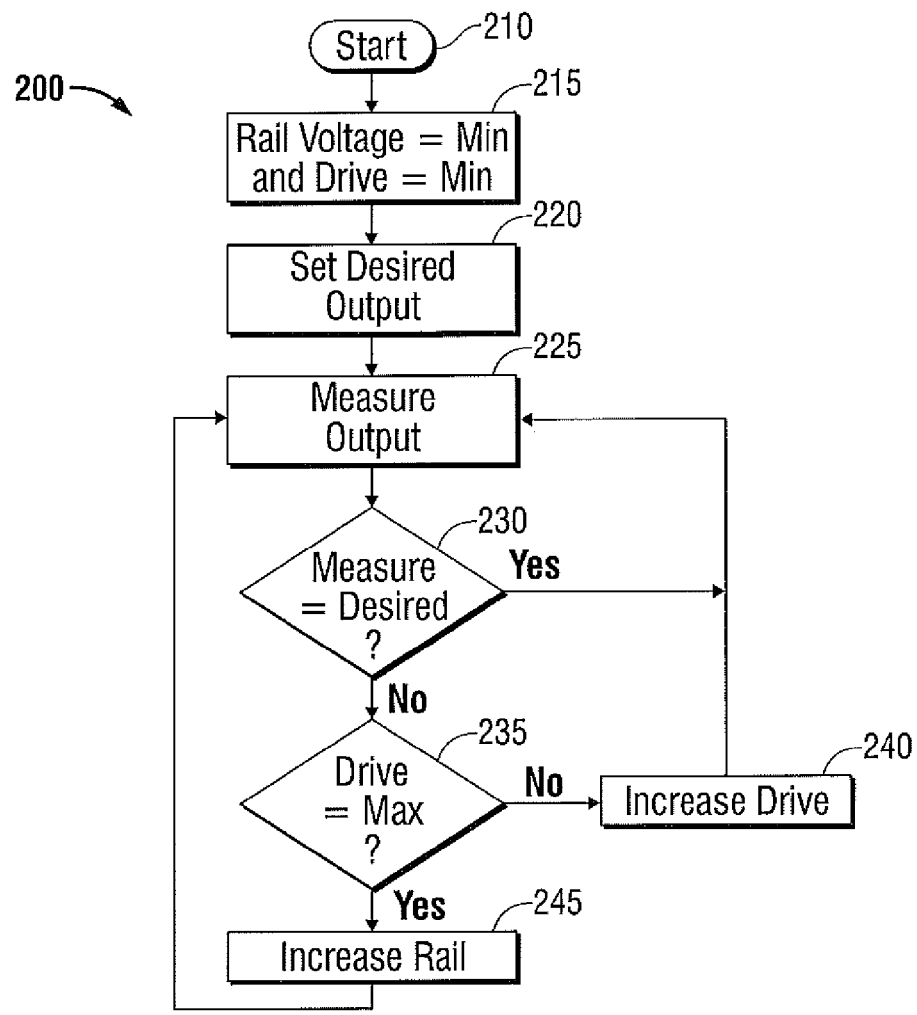
FIG. 3 is a flow diagram of a method of controlling rail voltage and drive attenuation of an amplifier in accordance with the present disclosure.

Drive controller 130 is configured to provide an input signal to the output stage 140. Drive controller 130 may include an oscillator 134 configured to generate a radiofrequency ablation signal that is operable coupled to an output thereof to an attenuation network 136. In an embodiment, drive controller 130 may include an RF signal input (not explicitly shown) that is operably coupled to an oscillator. Drive controller 130 includes a drive control input that is adapted to receive a drive control signal from amplifier controller 110. Attenuation network 136 is responsive to the drive control signal, whereby the drive control signal defines the degree of attenuation provided by attenuation network 136. Drive controller 130 may provide signal attenuation by any suitable manner of attenuation, for example, and without limitation, voltage-controlled amplifier (e.g., a unity gain voltage controlled amplifier), a digital potentiometer, or a digitally-switched voltage dividing network Turning to FIG. 3, a rail voltage control method 200 for operating push-pull amplifier 100 shows initial step 210 which is an entry point wherein initialization may be performed. In the step 215, the rail voltage and drive level are set to a minimum. In an embodiment, amplifier controller 110 causes rail voltage controller 120 to output a minimum voltage, which may be in a range of about 0V to about 30V, e.g., 14V, and amplifier controller 110 may additionally or alternatively cause drive controller 130 to be set to a minimum drive level (i.e., maximum drive attenuation.) In the step 220, a desired output level is set, e.g., wherein a user selects a desired output level, which may be, for example and without limitation, an output voltage, output current, or other signal property. In the step 225, a main operational loop is entered wherein an output level is measured. For example, amplifier controller 110 may poll an input thereof corresponding to an output of sensor 150. Sensor 150 may provide a signal to amplifier controller 110 in analog format, or in digital format. In one embodiment, the step 225 may include an analog-to-digital conversion of the sensed output.

In the step 230, the measured level is compared to the desired level to determine whether the output level equals the desired level. It is to be understood that comparisons performed by the methods disclosed herein may include a tolerance within which the values being compared are evaluated, e.g., quantities may be within a range and/or substantially equal to be deemed equal. If a positive determination is made (e.g., output level is acceptably equal to the desired level as described herein) the process iterates to the step 225.

If a negative determination is made, that is, the output level does not equal the desired level, the step 235 is performed wherein a determination is made whether the drive level is set to a maximum value (or alternatively, within a tolerance range of, or substantially equal to, a maximum value.) If it is determined the drive level is set to a maximum value (i.e., minimum drive attenuation), the step 245 is performed wherein the rail voltage is increased. For example, amplifier controller 110 causes rail voltage controller 120 to increase the output voltage thereof. The output voltage may be increased by a predetermined amount. Subsequent to step 245, the process iterates to step 225. Conversely, if it is determined the drive level is not set to a maximum value, the step 240 is performed wherein the drive level is increased (i.e., drive attenuation is reduced). Subsequent to step 240, the process iterates to the step 225. In an embodiment, step 240 or step 245 includes a time delay.

Figure 4:
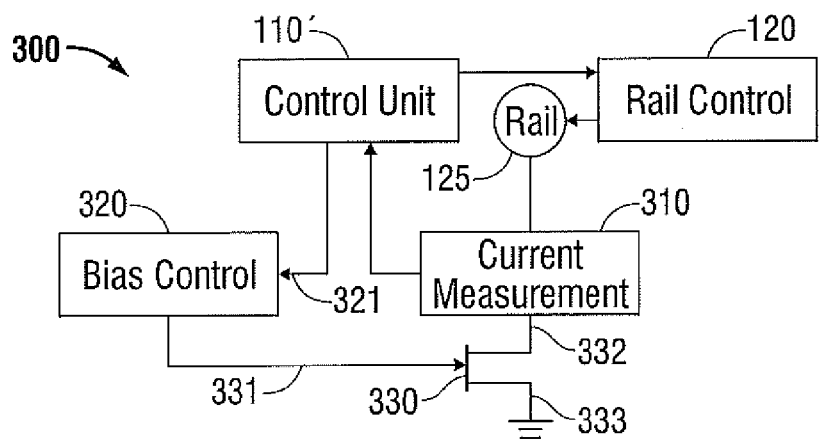
FIG. 4 shows a block diagram of an amplifier having rail voltage and bias control in accordance with the present disclosure.
Figure 6:
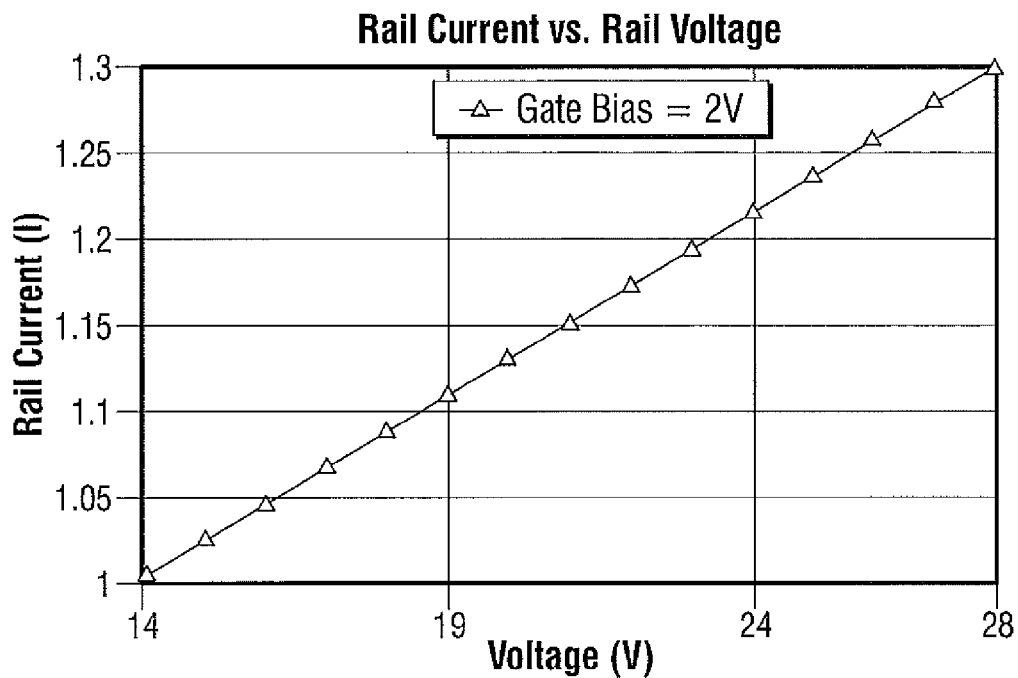
FIG. 6 is a graph illustrating a relationship between rail current and rail voltage in accordance with the present disclosure.

With reference now to FIG. 4, an amplifier stage 300 according to the present disclosure includes a gain element 330, which may be a field effect transistor (FET), a gallium nitride (GaN) high electron mobility transistor (HEMTs), gallium arsenide (GaAs) FET, or a laterally diffused metal oxide semiconductor transistor (LDMOS), such as without limitation, a BLC6G10LS-160 as described hereinabove. Unless stated otherwise, in the following description is it to be understood that gain element 330 is an N channel device, such as a BLC6G10LS-160. Gain element 330 may alternatively be a P-channel device. Gate 331 of gain element 330 may be slightly biased at about 0.1 A of the rail current. However, as seen in FIG. 6 rail current will increase as rail voltage is increased. To address this, amplifier stage 300 includes a current sensor 310 that is adapted to measure a bias current of gain element 330 and communicate a value corresponding thereto to amplifier controller 110'. Amplifier 300 includes bias controller 320 that is in operable communication with amplifier controller 110'. Bias controller 320 is responsive to a bias control signal received from amplifier controller 110' to provide a bias current to gain element 330 in accordance with a method described below.

Figure 5:
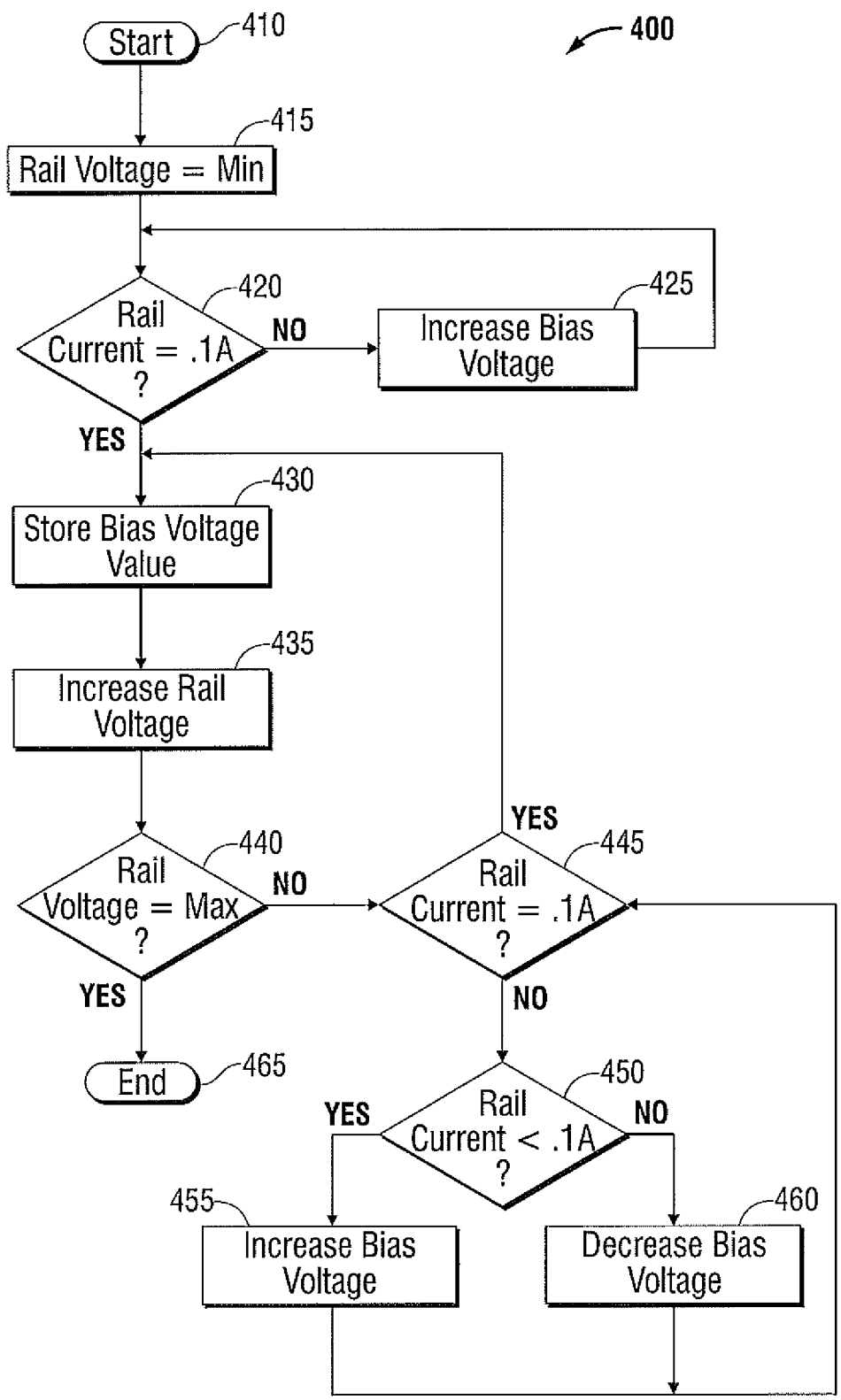
FIG. 5 is a flow diagram of a method of controlling rail voltage and bias voltage of an amplifier in accordance with the present disclosure.

As shown in FIG. 5, a biasing method 400 for biasing a gain stage 300 begins at step 410 which is an entry point wherein initialization may be performed. In step 415, the rail voltage is set to an initial value, which may be a minimum value, e.g., 14V. In step 420, the rail current is measured and compared to a target current, e.g., 0.1 A, to determine whether the rail current equals the target rail current. If the measured current does not equal the target current, step 425 is performed wherein the bias voltage is increased. In an embodiment, the bias voltage is increased by a fixed amount. Steps 420 and 425 are repeated iteratively until the rail current equals the target current.

If the measured rail current equals the target current, step 430 is performed wherein the bias voltage is stored. Step 435 is then performed wherein the rail voltage is increased. A comparison is performed in step 440 to determine whether the rail voltage equals a maximum voltage. If the rail voltage equals a maximum voltage, the bias adjustment is complete and the process concludes in step 465.

If, however, the rail voltage does not equal a maximum voltage, step 445 is performed wherein it is determined whether the rail current equals a target current value, e.g., 0.1 A. If the rail current is determined to equal the target current, the process iterates at step 430 wherein the bias voltage is stored and the process continues as described herein. If the rail current does not equal the target current value, the rail current is tested in the step 450 to determine whether the rail current is less than the target current value. Hit is determined the rail current is less than the target current value, the step 455 is performed wherein the bias voltage is increased, whereupon the process iterates to step 445. Conversely, if it is determined the rail current is not less than (e.g., greater than) the target current value, the step 460 is performed wherein the bias voltage is decreased, whereupon the process iterates to step 445.

In embodiments wherein the gain element 330 is P-channel device, the bias voltage is adjusted in an opposite manner, e.g., decreased in the step 455 and/or increased in the step 460, in accordance with the characteristics of a P-channel device.

Figure 7:
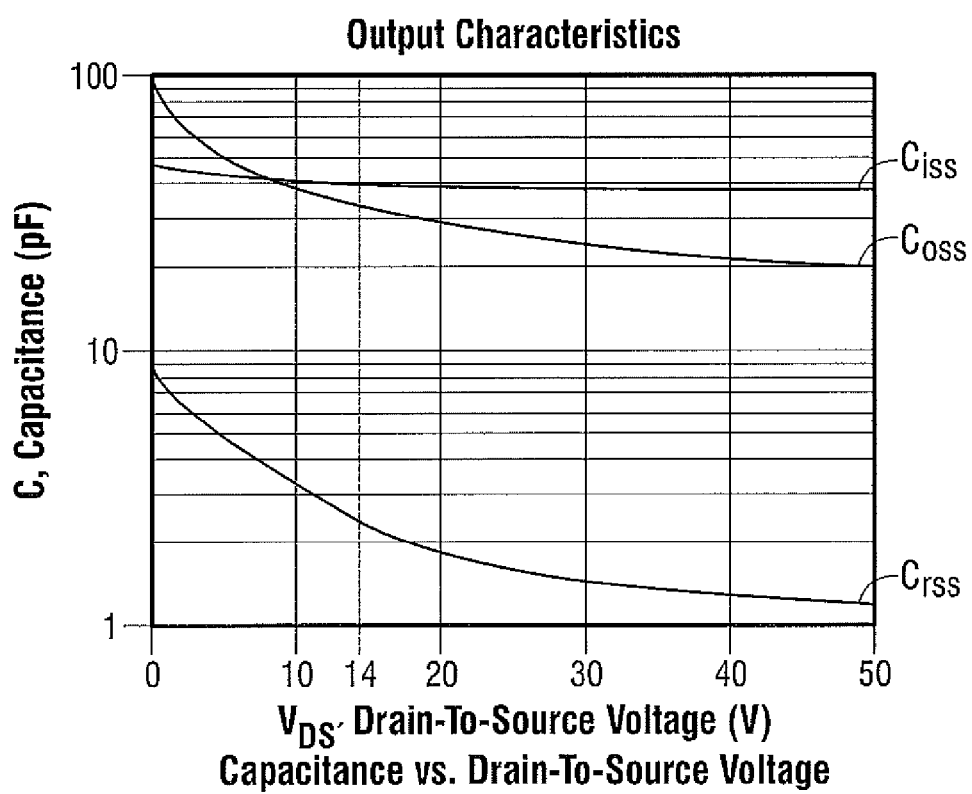
FIG. 7 is a graph illustrating a relationship between capacitance and drain-to-source voltage in accordance with the present disclosure.
Figure 8:
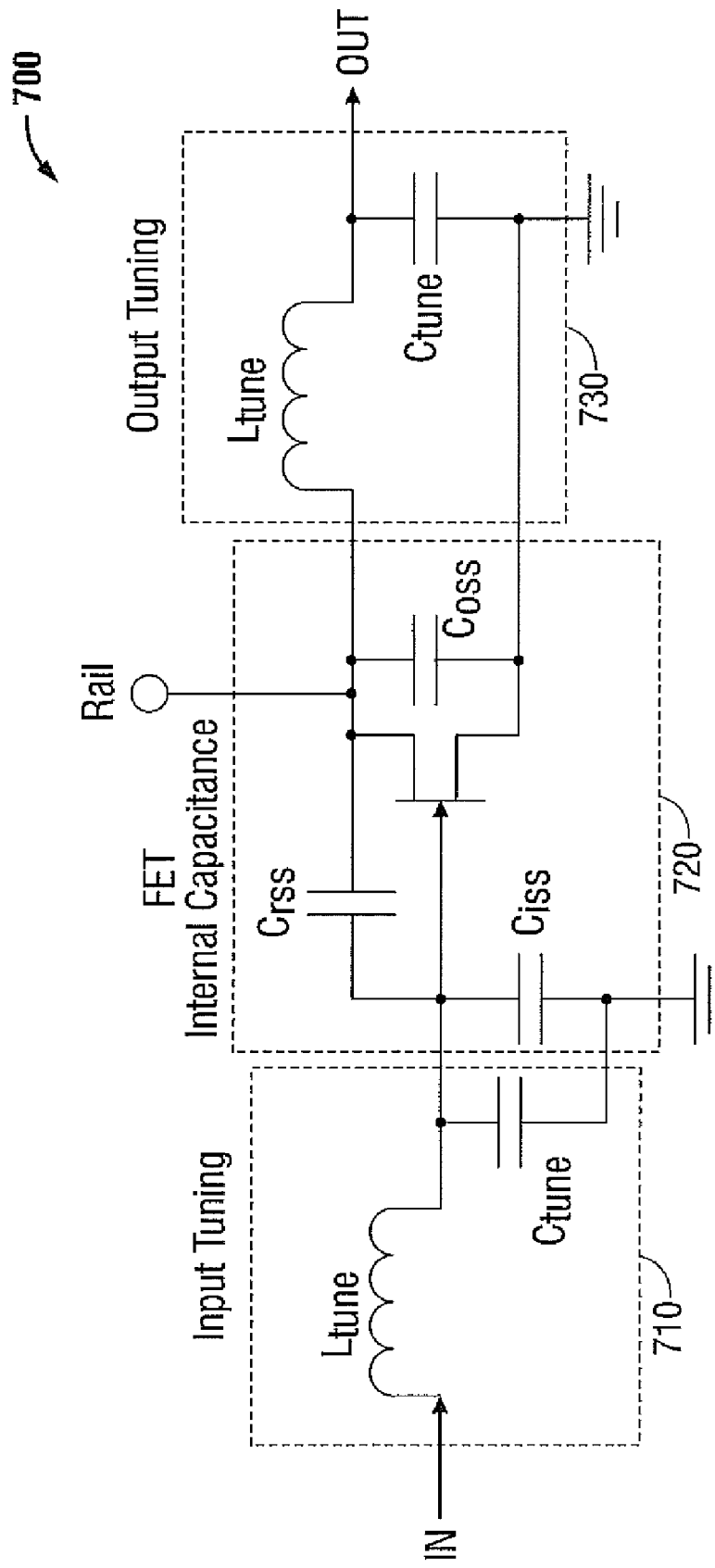
FIG. 8 is a circuit diagram illustrating actual and equivalent inductive and capacitive elements of a gain stage of an amplifier in accordance with the present disclosure.

FIG. 7 illustrates a relationship between internal capacitances $C_{iss}$, $C_{oss}$, and $C_{rss}$ exhibited by a gain element, e.g., a FET, and a drain-to-source voltage $V_{DS}$, e.g., a rail voltage. As can be seen, as $V_{DS}$ decreases, the internal capacitances $C_{iss}$, $C_{oss}$, and $C_{rss}$ of the FET increase. The capacitance increases exponentially as $V_{DS}$ approaches zero. In a tuned gain stage 700 such as illustrated in FIG. 8, reducing $V_{DS}$, e.g., the rail voltage, lower than about 14V would result in a significant detuning of gain stage 700, which may result in decreased efficiency and instability. Accordingly, the present disclosure contemplates a minimum rail voltage of about 14V.

Figure 9A:
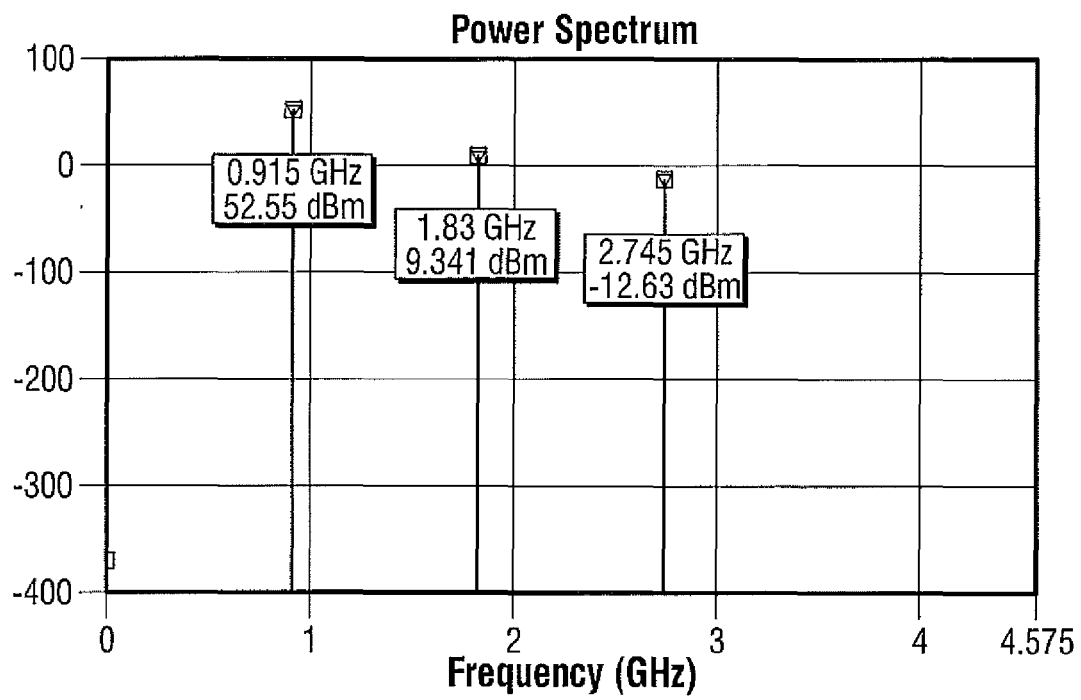
FIG. 9A is a graph illustrating the harmonic power distribution of a prior-art amplifier.
Figure 9B:
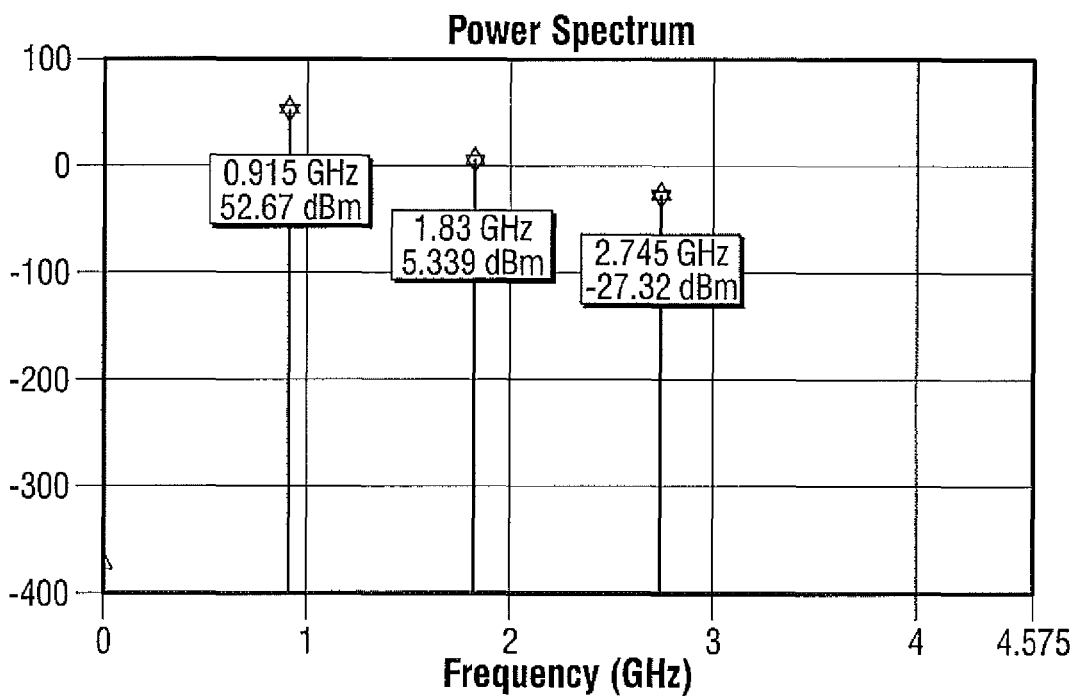
FIG. 9B is a graph illustrating the harmonic power distribution of an amplifier in accordance with the present disclosure.

A comparison between a prior art amplifier, and an amplifier in accordance with the present disclosure, is shown in FIG. 9A which illustrates a graph of the power spectrum of a prior art single stage (class B) amplifier operating at 915 MHz at full power of about +52.55 dBm. As can be seen, a +9.341 dBm second harmonic is present at 1.83 GHz and a third harmonic of −12.63 dBm is present at 2.745 GHz, FIG. 9B illustrates an amplifier according to the present disclosure operating on a similar 915 MHz input signal as the FIG. 9A example. At full power of about +52.67 dBm, which for illustration purposes only is effectively the same as the prior art example (i.e., within 0.12 dBm of the prior art example), the FIG. 9B spectrum of the presently disclosed amplifier exhibits a second harmonic of 5.339 dBm, and a third harmonic of −27.32 dBm. This represents an improvement over the prior art of about a 4 dBm reduction in second-order harmonics and of about a 14.7 dBm reduction in third-order harmonics.

Figure 11A:
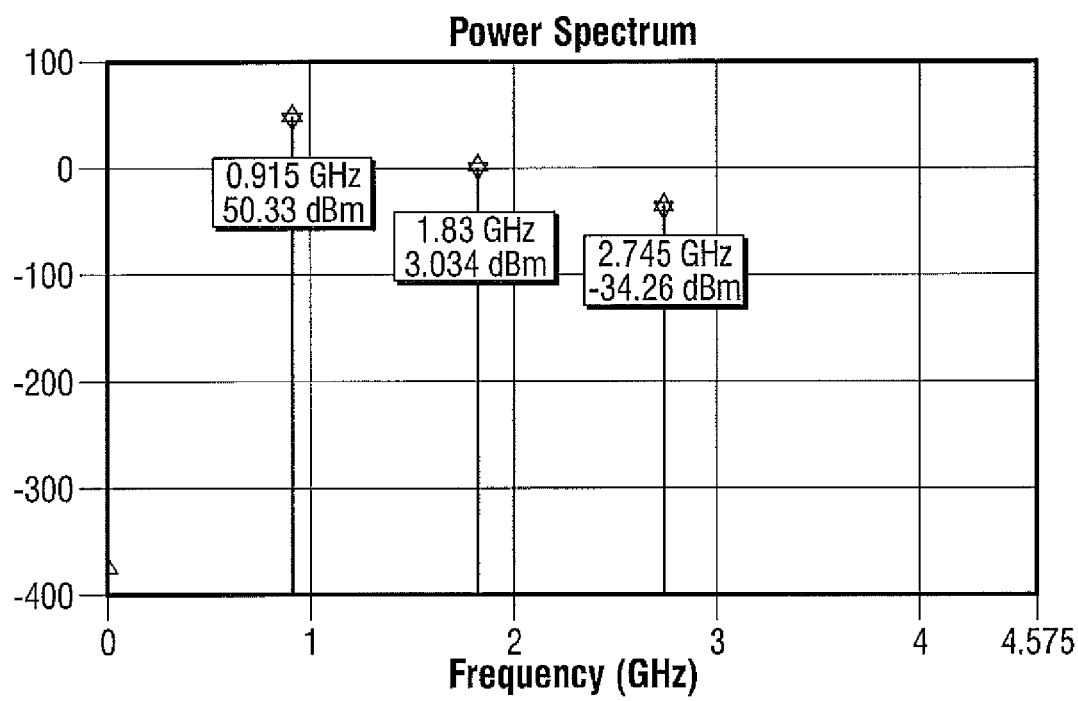
FIG. 11A is a graph illustrating the harmonic power distribution of a prior-art amplifier operating at about half-power.
Figure 11B:
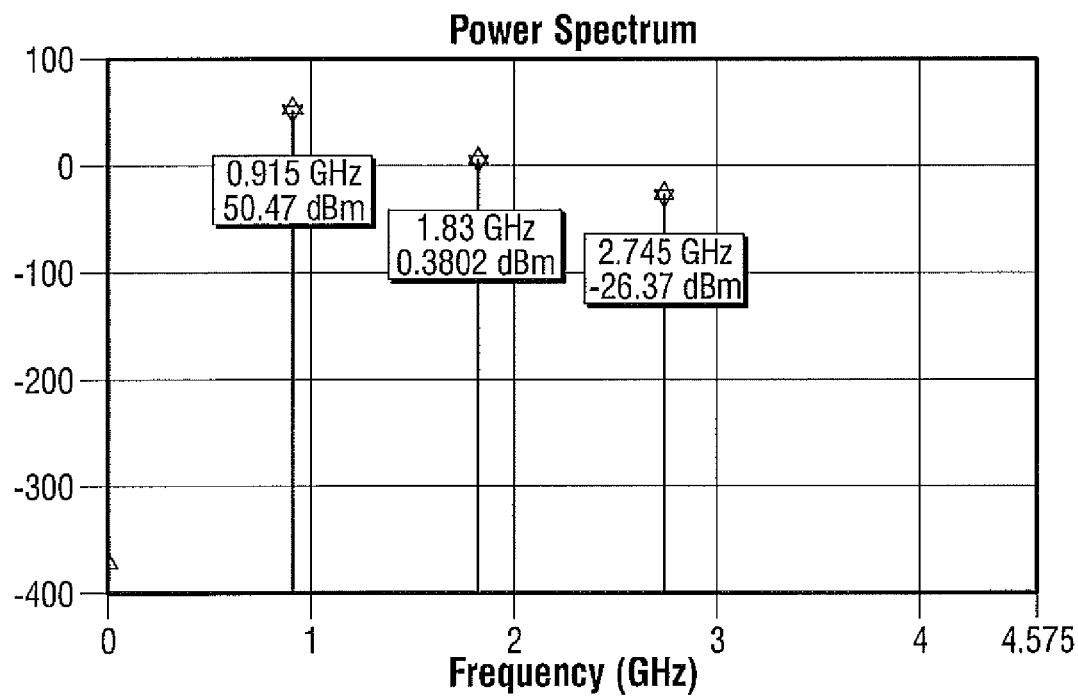
FIG. 11B is a graph illustrating the harmonic power distribution of an amplifier in accordance with the present disclosure operating at about half-power.

A comparison of harmonic performance at about half-power is illustrated with reference to FIGS. 11A and 11B, which correspond to a prior art amplifier and an amplifier in accordance with the present disclosure, respectively. As can be seen, the present amplifier exhibits an improvement of about a 3 dBm reduction in second-order harmonics. Third-order harmonics, however, increase about 12 dBm in the present amplifier.

Figure 10A:
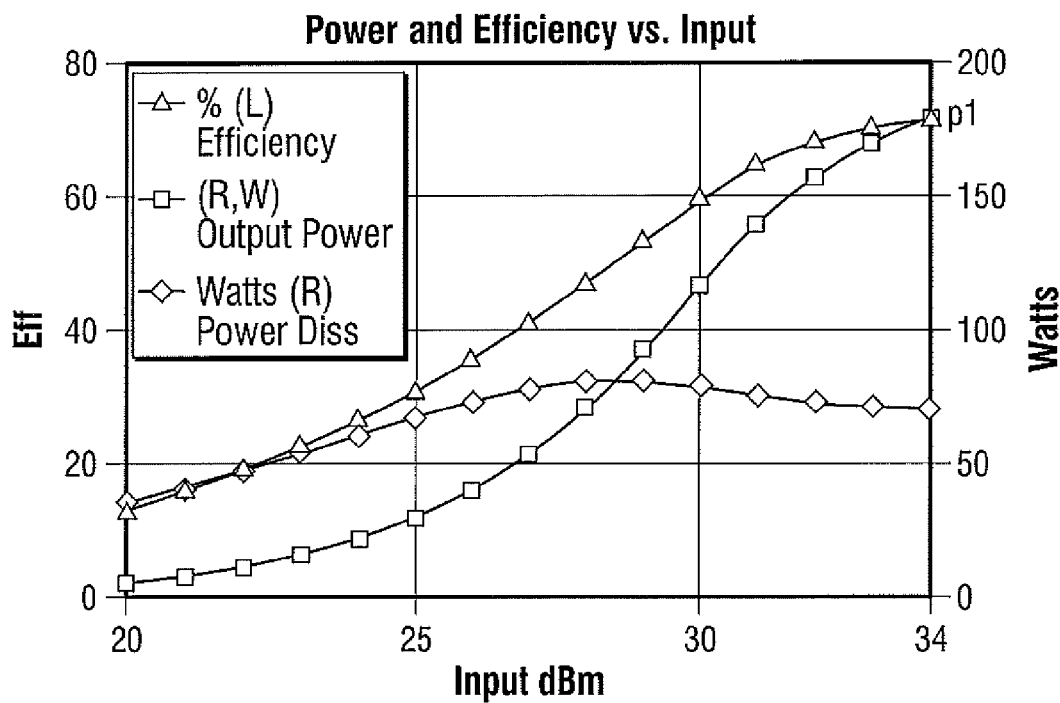
FIG. 10A is a graph illustrating a relationship between output power and efficiency of a prior-art amplifier.
Figure 10B:
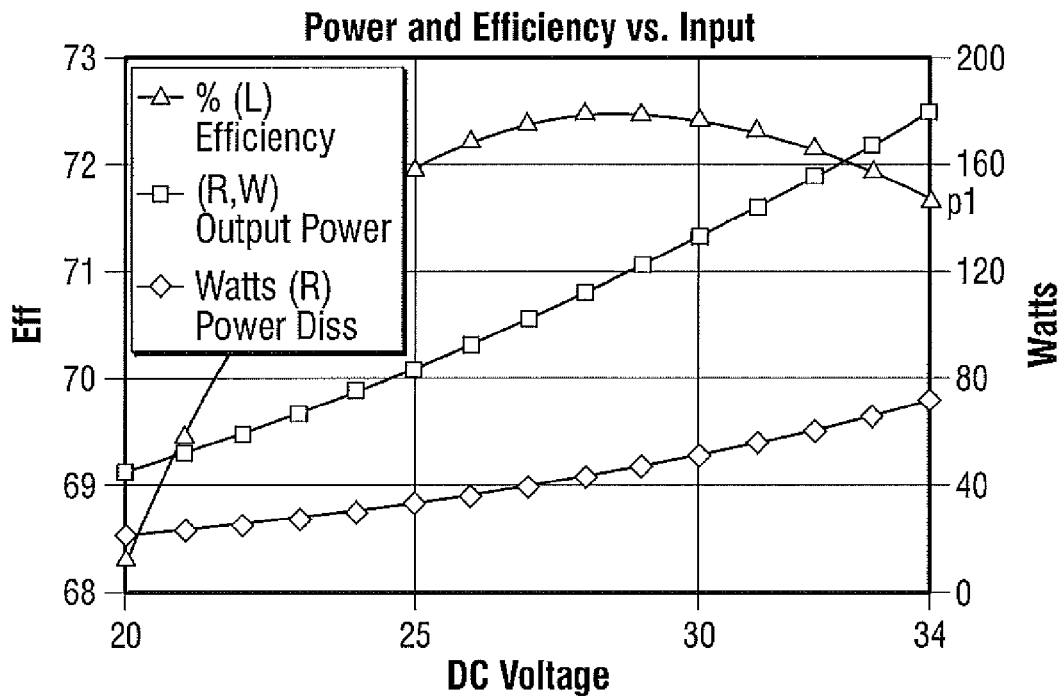
FIG. 10B is a graph illustrating a relationship between output power and efficiency of an amplifier in accordance with the present disclosure.

Continuing the comparison, FIG. 10A is a graph representing a relationship between output power and efficiency to increasing input power level of a prior art amplifier, while FIG. 10B represents a relationship between output power and efficiency to increasing rail voltage of an amplifier according to the present invention. As will be readily appreciated, an amplifier according to the present invention exhibits a much higher and flatter efficiency curve than that of the prior art amplifier. For example, and with reference to FIG. 10A, a prior art amplifier at about 50% output power exhibits an efficiency of about 40%. In contrast, and with reference to FIG. 10B, an amplifier in accordance with the present disclosure at about 50% output power exhibits an efficiency of out 70%. As can be seen, the prior art amplifier has an efficiency which can be as low as 15%, while the efficiency of the presently disclosed amplifier never drops below 68% over an entire operating range thereof.

While several embodiments of the disclosure have been shown in the drawings and/or discussed herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. The claims can encompass embodiments in hardware, software, or a combination thereof. Those skilled in the art will envision other modifications within the scope and spirit of the claims appended hereto.

What is claimed is:

1. An electromagnetic signal amplifier, comprising:
    a gain stage electrically disposed between a supply rail and a return rail, wherein the gain stage includes an input and an output;
    a rail voltage controller operably coupled to at least one of the supply rail and the return rail, the rail voltage controller being configured to provide a rail voltage responsive to a rail voltage control signal;
    a drive controller operably coupled to the gain stage input and configured to provide an input signal thereto responsive to a drive control signal;
    at least one sensor configured to sense an operational parameter of the amplifier and to provide a sensor signal corresponding thereto; and
    an amplifier controller adapted to receive the at least one sensor signal and in response thereto provide at least one of a rail voltage control signal to the rail voltage controller and a drive control signal to the drive controller.

2. The electromagnetic signal amplifier in accordance with claim 1, wherein the amplifier controller is adapted to receive an input corresponding to a target output level.

3. The electromagnetic signal amplifier in accordance with claim 1, wherein the gain stage comprises at least two gain elements arranged in a push-pull configuration.

4. The electromagnetic signal amplifier in accordance with claim 3, wherein the at least two gain elements are selected from the group consisting of transistors, field-effect transistors, and laterally diffused metal oxide semiconductors.

5. The electromagnetic signal amplifier in accordance with claim 1, wherein the sensor is configured to sense an output voltage.

6. The electromagnetic signal amplifier in accordance with claim 1, wherein the sensor is configured to sense a bias current.

7. The electromagnetic signal amplifier in accordance with claim 6, wherein:
    the gain stage includes a bias circuit;
    the electromagnetic signal amplifier further comprises a bias controller operably coupled to the bias circuit and configured to provide a bias voltage thereto responsive to a bias control signal and wherein the amplifier controller provides a bias control signal to the bias controller in response to the at least one sensor signal.

8. The electromagnetic signal amplifier in accordance with claim 7, wherein the amplifier controller:
    sets the rail voltage to an initial value;
    measures a rail current;
    determines whether the rail current meets a target criteria;
    increases a bias voltage in response to a determination that the rail current does not meet a target criteria;
    stores the bias voltage in response to a determination that the rail current meets a target criteria; and
    increases the rail voltage.

9. The electromagnetic signal amplifier in accordance with claim 1, wherein the amplifier controller:

sets a rail voltage to a minimum value;
sets a drive signal to a minimum amplitude;
measures an output signal;
determines whether the output signal meets a predetermined criteria;
responds to a determination the output signal does not meet the predetermined criteria by determining whether the drive signal is set to a maximum value;
responds to a determination the drive signal is not set to a maximum value by increasing the drive signal; and
responds to a determination the drive signal is set to a maximum value by increasing the rail voltage.

10. A method of controlling an electromagnetic signal amplifier, comprising:
setting a rail voltage to a minimum value;
setting a drive signal to a minimum amplitude;
measuring an output signal;
determining whether the output signal meets a predetermined criteria;
responding to a determination the output signal does not meet the predetermined criteria by determining whether the drive signal is set to a maximum value;
responding to a determination the drive signal is not set to a maximum value by increasing the drive signal; and
responding to a determination the drive signal is set to a maximum value by increasing the rail voltage.

11. The method in accordance with claim 10, wherein the predetermined criteria is determined in response to a user input.

12. The method in accordance with claim 10, wherein the minimum rail voltage value is in a range of about 0 volts to about 30 volts.

13. The method in accordance with claim 10, wherein the minimum rail voltage value is about 14 volts.

14. The method in accordance with claim 10, wherein the output criteria is an output power.

15. The method in accordance with claim 10, wherein the output signal is evaluated by at least one of a root-mean-square, peak-to-peak, and moving average measurement.

16. A method of controlling an electromagnetic signal amplifier, comprising:
setting a rail voltage to an initial value;
measuring a rail current;
determining whether the rail current meets a target criteria;
increasing a bias voltage in response to a determination that the rail current does not meet a target criteria;
storing the bias voltage in response to a determination that the rail current meets a target criteria; and
increasing the rail voltage.

17. The method in accordance with claim 16, wherein the initial rail voltage value is in a range of about 0 volts to about 30 volts.

18. The method in accordance with claim 16, wherein the initial rail voltage value is about 14 volts.

19. The method in accordance with claim 16, wherein the target criteria includes operating a gain element substantially outside of a linear operating region thereof.

20. The method in accordance with claim 19, wherein the initial rail voltage value is determined in accordance with an output capacitance characteristic of the gain element.

21. The method in accordance with claim 16, wherein the target criteria corresponds to a rail current of about 0.1 amperes.

* * * * *